US012655937B2

(12) United States Patent
Nakano et al.

(10) Patent No.: US 12,655,937 B2
(45) Date of Patent: Jun. 16, 2026

(54) INTERFACE MODULE WITH SAFETY INTERLOCK SYSTEM, STORAGE MEDIUM, AND SAFETY VERIFICATION METHOD

(71) Applicant: ASM IP Holding, B.V., Almere (NL)

(72) Inventors: Masashi Nakano, Tama (JP); Wataru Kobayashi, Sagamihara (JP)

(73) Assignee: ASM IP Holding B.V., Almere (NL)

( * ) Notice: Subject to any disclaimer, the term of this patent is extended or adjusted under 35 U.S.C. 154(b) by 899 days.

(21) Appl. No.: 17/823,249

(22) Filed: Aug. 30, 2022

(65) Prior Publication Data

US 2023/0069600 A1      Mar. 2, 2023

Related U.S. Application Data

(60) Provisional application No. 63/239,570, filed on Sep. 1, 2021.

(51) Int. Cl.
*F16P 3/08* (2006.01)
*B25J 21/00* (2006.01)
(Continued)

(52) U.S. Cl.
CPC ................. *F16P 3/08* (2013.01); *B25J 21/00* (2013.01); *F04D 27/001* (2013.01); *F24F 11/0001* (2013.01); *G05B 19/058* (2013.01); *G08B 7/06* (2013.01); *G08B 21/18* (2013.01); *F24F 2110/76* (2018.01); *G05B 2219/14006* (2013.01); *H10P 72/0402* (2026.01)

(58) Field of Classification Search
CPC . F16P 3/08; B25J 21/00; F04D 27/001; F04D 29/701; F24F 11/0001; F24F 2110/76; F24F 3/167; G05B 19/058; G05B 2219/14006; G08B 7/06; G08B 21/18; H01L 21/67017; H01L 21/67253
See application file for complete search history.

(56) References Cited

U.S. PATENT DOCUMENTS 6,996,453 B2      2/2006  Ahn
9,272,315 B2      3/2016  Chou
(Continued)

FOREIGN PATENT DOCUMENTS

CN          105453246 A  *  3/2016  ....... H01L 21/67248
JP          2003329279 A  *  11/2003
(Continued)

OTHER PUBLICATIONS

English Translation of "CN-105453246-A" (Year: 2016).*
(Continued)

*Primary Examiner* — Charles R Kasenge
(74) *Attorney, Agent, or Firm* — Banner & Witcoff, Ltd.

(57) ABSTRACT

Examples of an interface module includes a fan filter unit having a fan and a filter, a housing surrounding a space adjacent to the filter, the housing includes a door, an upper housing surrounding a space adjacent to the fan, a first port provided in the upper housing, a second port communicating to a FFU internal space, the FFU internal space is a space between the fan and the filter in the fan filter unit, and a differential pressure gauge connected to the first port and the second port to detect a differential pressure between an interior of the upper housing and the FFU internal space.

15 Claims, 8 Drawing Sheets

(51) Int. Cl.

| | |
|---|---|
| *F04D 27/00* | (2006.01) |
| *F24F 11/00* | (2018.01) |
| *G05B 19/05* | (2006.01) |
| *G08B 7/06* | (2006.01) |
| *G08B 21/18* | (2006.01) |
| *F24F 110/76* | (2018.01) |
| *H10P 72/00* | (2026.01) |

(56) References Cited

U.S. PATENT DOCUMENTS

| | | | |
|---|---|---|---|
| 10,403,514 B1 | 9/2019 | Hagino | |
| 2006/0259195 A1* | 11/2006 | Eliuk | B01F 33/8442 |
| | | | 700/245 |
| 2011/0111095 A1* | 5/2011 | Chatterjee | A23L 33/16 |
| | | | 426/271 |

| | | | | |
|---|---|---|---|---|
| 2015/0071742 A1 | 3/2015 | Matsuzawa et al. | | |
| 2018/0358239 A1* | 12/2018 | Senn | | H01L 21/67778 |
| 2022/0121126 A1* | 4/2022 | Utsunomiya | | H01L 21/67017 |

FOREIGN PATENT DOCUMENTS

| | | | | | |
|---|---|---|---|---|---|
| KR | 20180131493 A | * | 12/2018 | | H01L 21/67034 |
| KR | 101949144 B1 | * | 2/2019 | | F04D 27/001 |
| KR | 20190096819 A | * | 8/2019 | | H01L 21/67017 |
| KR | 20190109244 A | | 9/2019 | | |

OTHER PUBLICATIONS

English Translation of "JP-2003329279-A" (Year: 2003).*
English Translation of "KR-101949144-B1" (Year: 2019).*
English Translation of "KR-20180131493-A" (Year: 2018).*
English Translation of "KR-20190096819-A" (Year: 2019).*

* cited by examiner

INTERFACE MODULE WITH SAFETY INTERLOCK SYSTEM, STORAGE MEDIUM, AND SAFETY VERIFICATION METHOD

FIELD

Examples are described which relate to an interface module having a fan filter unit, a storage medium, and a safety verification method.

BACKGROUND

The interface module includes a substrate transport apparatus for transferring a substrate. Filling the interior of the interface module with $N_2$ gas to reduce oxygen ($O_2$ and $H_2O$) concentration avoids or suppresses a formation of a natural oxide film on the substrate to be transported. According to an example, when the oxygen concentration is 100 ppm or less, it is possible to suppress the natural oxide film from being formed on the substrate. The interface module described above is referred to as N2-Equipment Front End Module (N2-EFEM).

It is necessary for a person to enter the interface module during maintenance work of the interface module. However, entering the interface module filled with $N_2$ gas is very dangerous. Before a person enters the interface module, the $N_2$ gas inside the interface module is replaced with Clean Dry Air (CDA).

For example, a plurality of oxygen concentration meters can be used to confirm that the $N_2$ gas inside the interface module has been replaced with the CDA. However, providing the oxygen concentration meter at each location of the interface module for safety verification makes the interface module very expensive. Moreover, it requires a complex interlock circuit.

SUMMARY

Some examples described herein may address the above-described problems. Some examples described herein may provide an interface module, a storage medium, and a safety verification method suitable for cost reduction.

In some examples, an interface module includes a fan filter unit having a fan and a filter, a housing surrounding a space adjacent to the filter, the housing includes a door, an upper housing surrounding a space adjacent to the fan, a first port provided in the upper housing, a second port communicating to a FFU internal space, the FFU internal space is a space between the fan and the filter in the fan filter unit, and a differential pressure gauge connected to the first port and the second port to detect a differential pressure between an interior of the upper housing and the FFU internal space.

DETAILED DESCRIPTION

Figure 1:
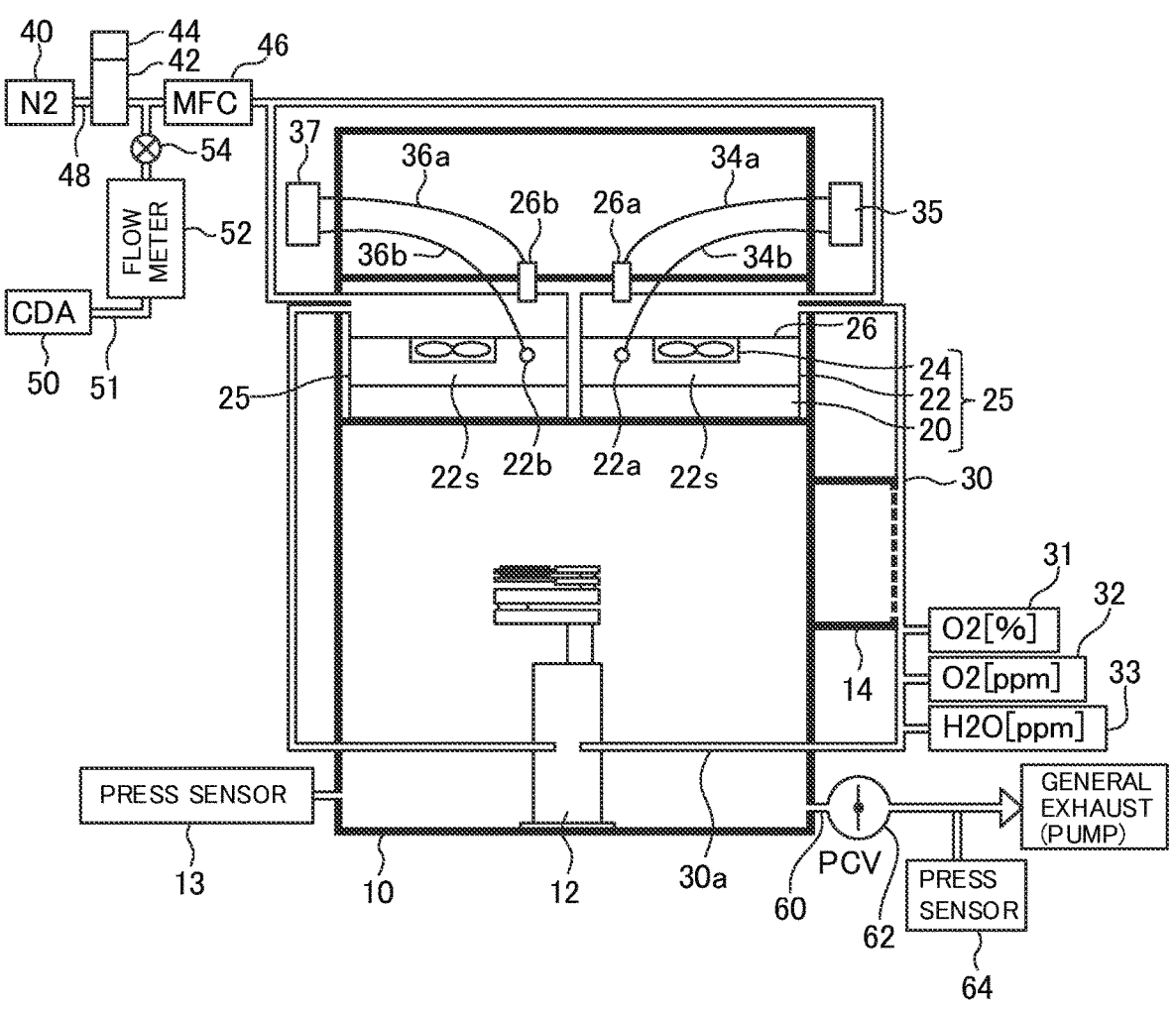
FIG. 1 is a schematic diagram of an interface module.

An interface module having a fan filter unit, a storage medium, and a safety verification method according to some examples will be described with reference to the accompanying drawings. The same or corresponding components will be assigned the same reference numerals and duplicate description may be omitted.

Embodiment

FIG. 1 is a schematic diagram of an interface module according to one example. The interface module may be provided as a N2-EFEM. The interface module includes a housing 10. In one example, a robotic arm 12 is provided in the housing 10 for transferring the substrate. According to another example, one or more transferring means are provided in the housing 10. In one example, the substrate is a wafer before or after processing. A housing pressure sensor 13 for measuring the pressure in the housing 10 is connected to the housing 10. According to one example, the housing pressure sensor 13 is a differential pressure gauge for measuring a differential pressure between an internal pressure and an external pressure of the housing 10.

The interface module includes at least one Fan Filter Unit (FFU) 25. Although two FFUs 25 are shown in FIG. 1, the number of FFU 25 may be one or more than three. According to one example, the FFU 25 includes an FFU housing 22, a fan 24, and a filter 20. A space between the fan 24 and the filter 20 in the FFU 25 is a FFU internal space 22s. A space adjacent the filter 20 is surrounded by the housing 10. According to one example, the housing 10 has a support plate that supports the FFU 25. A gas passing through the filter 20 passes through a plurality of holes provided in the support plate and is provided into the housing 10.

A space adjacent the fan 24 is surrounded by an upper housing 26. According to one example, the upper housing 26 is provided above the FFU 25. A gas provided in the upper housing 26 is introduced into the FFU internal space 22s by rotation of the fan 24 and filtered by the filter 20. A first port 26a is provided in the upper housing 26. According to one example, the first port 26a is a pressure sampling port that allows pressure sensing inside the upper housing 26. In other words, the first port 26a is a pressure sampling port of an inlet of the fan 24. The first port 26a is, for example, a metal tube that provides a hole communicating with the interior of the upper housing 26. Similarly, a first port 26b is provided in the upper housing 26 on the left side.

Further, the FFU 25 is provided with a second port 22a. According to one example, the second port 22a is a pressure sampling port that allows pressure sensing inside the FFU internal space 22s. In other words, the second port 22a is a pressure sampling port of an outlet of the fan 24. The second port 22a is, for example, a metal tube that provides a hole communicating with the interior of the FFU housing 22. Similarly, the FFU 25 shown in the left side is provided with a second port 22b.

The interface module of FIG. 1 includes a differential pressure gauge 35. The differential pressure gauge 35 is configured to detect a differential pressure between a pressure inside the upper housing 26 and a pressure of the FFU internal space 22s. According to one example, the differential pressure gauge 35 is connected to the first port 26a via a tube 34a and is connected to the second port 22a via a tube 34b. With this configuration, the pressure inside the upper housing 26 and the pressure of the FFU internal space 22s are reflected in the differential pressure gauge 35. Therefore, the differential pressure gauge 35 can detect the differential pressure between the pressure inside the upper housing 26 and the pressure of the FFU internal space 22s.

The interface module of FIG. 1 further includes a differential pressure gauge 37 to detect a differential pressure between a pressure inside the upper housing 26 on the left side and a pressure of the FFU internal space 22s on the left side. According to one example, the differential pressure gauge 37 is connected to the first port 26b via a tube 36a and is connected to the second port 22b via a tube 36b. With this configuration, the pressure inside the upper housing 26 on the left side and the pressure of the FFU internal space 22s on the left side are reflected in the differential pressure gauge 37. Therefore, the differential pressure gauge 37 can detect the differential pressure between the pressure inside the upper housing 26 on the left side and the pressure of the FFU internal space 22s on the left side.

If the fan 24 is rotating, the pressure inside the upper housing 26 will be less than the pressure of the FFU internal space 22s. On the other hand, if the fan 24 is not rotating, the pressure inside the upper housing 26 is substantially equal to the pressure of the FFU internal space 22s. Therefore, it is possible to determine whether the fan 24 is rotating by monitoring the differential pressure.

According to one example, a circulation duct 30 is connected both to the upper housing 26 and the housing 10. A portion of the circulation duct 30 extends into the interior of the housing 10 and is referred to as an inside duct 30a. Holes are drilled in the inside duct 30a to allow the circulation duct 30 to communicates with an inside of the housing 10. According to one example, oxygen sensors 31, 32 and a $H_2O$ sensor 33 are attached to the circulation duct 30 to detect a $O_2$ concentration and a $H_2O$ concentration. In this example, a cooling stage 14 is provided for temporary storage of wafers in the housing 10. The cooling stage 14 is connected to the interior of the housing 10 and also to the circulation duct 30.

As the fan 24 of the FFU 25 rotates, a gas in the upper housing 26 is emitted into the interior of the housing 10. According to one example, a gas is provided to the upper housing 26 from a nitrogen gas source 40 or a CDA source 50.

The nitrogen gas source 40 and the upper housing 26 are connected by a nitrogen gas supply pipe 48. A solenoid valve (SV) 42 is attached to the nitrogen gas supply pipe 48. The SV 42 opens and closes the nitrogen gas supply pipe 48 according to instructions. A limit switch 44 is attached to the SV 42 to monitor the operation of the SV 42. Specifically, the limit switch 44 detects a discrepancy between an input signal to the SV 42 and an actual position of a valve of the SV 42, based on a function of detecting the input signal and the actual position. In another example, the SV 42 and the limit switch 44 may be replaced by other configurations.

The CDA source 50 and the upper housing 26 is connected by a CDA supply pipe 51. A valve 54 and a flow meter 52 are attached to the CDA supply pipe 51. The valve 54 is provided for opening and closing the CDA supply pipe 51. The flow meter 52 is provided for detecting an amount of the CDA flowing through the CDA supply pipe 51.

A part of the nitrogen gas supply pipe 48 close to the nitrogen gas source 40 and a part of the CDA supply pipe 51 close to the CDA source 50 are separate pipes. However, in one example, a part of the nitrogen gas supply pipe 48 close to the upper housing 26 and a part of the CDA supply pipe 51 close to the upper housing 26 has a common tube. According to an example, a mass flow controller (MFC) 46 is attached to the common tube to adjust a flow rate of a gas.

An exhaust pipe 60 is attached to the housing 10. According to one example, a pressure control valve 62 is configured to regulate the flow rate of an exhaust gas flowing through the exhaust pipe 60. An exhaust pressure sensor 64 is attached to the exhaust pipe 60 to measure a pressure in the exhaust pipe 60. According to an example, the exhaust pressure sensor 64 is a differential pressure gauge for measuring a differential pressure between an internal pressure and an external pressure of the exhaust pipe 60.

Figure 2:
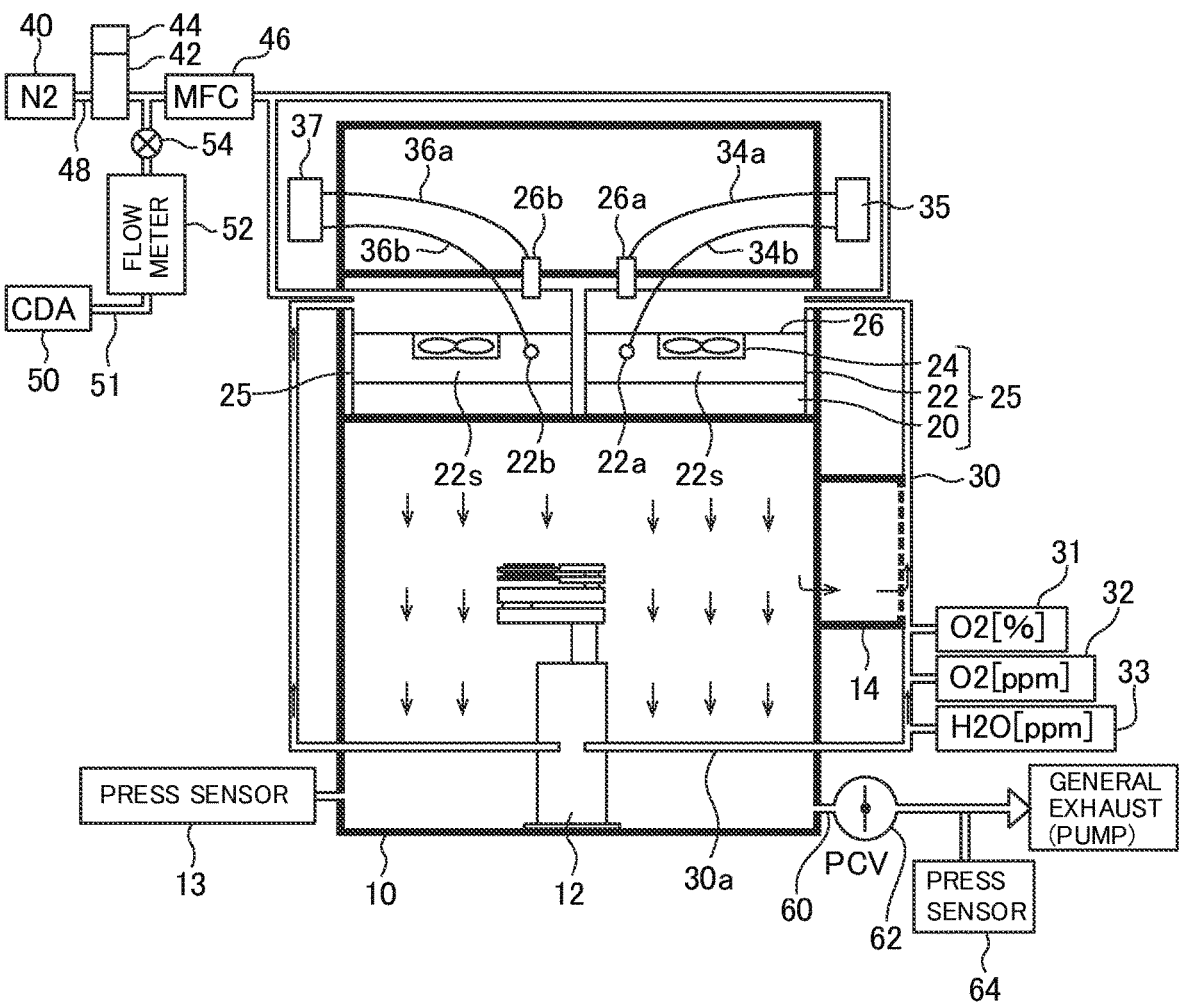
FIG. 2 shows a gas flow.

FIG. 2 is a diagram showing an example of gas flow in the interface module. Arrows in FIG. 2 indicate the gas flow formed by the fan 24. First, the upper housing 26 is provided with the $N_2$ gas or the CDA. A gas in the upper housing 26 is introduced into the FFU internal space 22s by a rotation of the fan 24 and is provided through the filter 20 into the housing 10. A portion of the gas provided in the housing 10 is returned into the upper housing 26 via the circulation duct 30, and another portion is exhausted from the exhaust pipe 60.

Figure 3:
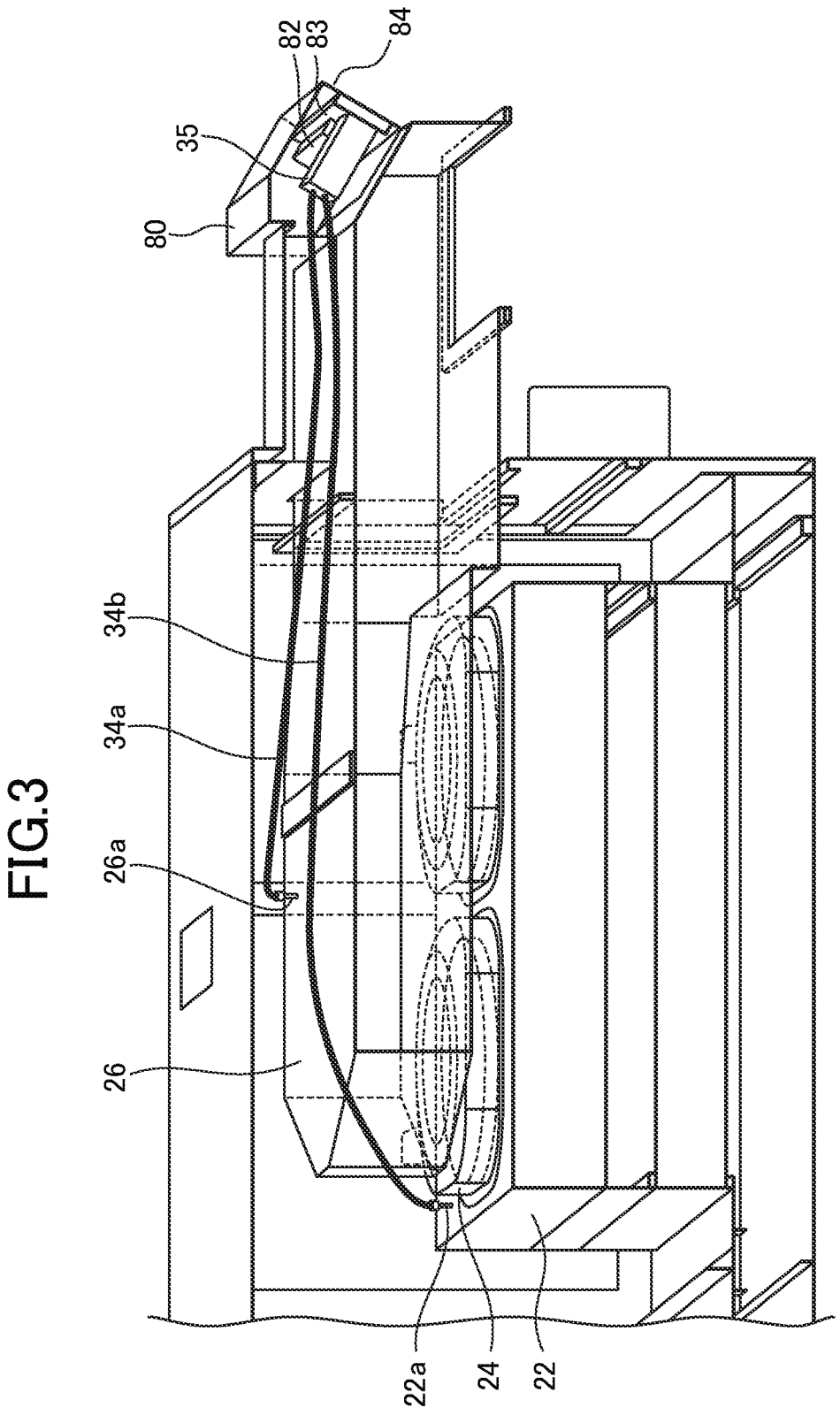
FIG. 3 shows an example of a first port and a second port.

FIG. 3 is a diagram showing an example of a connection position of the differential pressure gauge 35. On a top surface of the FFU housing 22, there are two cylindrical protrusions in which the fan 24 is stored. The two protrusions are collectively covered with the upper housing 26. In the example of FIG. 3, only one upper housing 26 is provided because the upper housing 26 provides gas to two FFUs 25. The upper housing 26 is depicted as transparent for convenience of illustration. In this example, the first port 26a is on a top surface of the upper housing 26. The second port 22a is on the top surface of the FFU housing 22.

FIG. 3 shows an operation box 80. According to one example, the differential pressure gauge 35, an alarm device 82, and a safety PLC 83 are stored in the operation box 80. The alarm device 82 is provided for detecting a failure of the fan 24. The alarm device 82, for example, is configured to issue an alarm when the fan 24 is not rotating even though the FFU 25 has received a command to rotate the fan 24. The safety PLC 83 is a PLC that is responsible for ensuring safety. According to one example, the safety PLC 83 is a PLC that permits opening of a door of the housing 10 after confirming that safety has been ensured.

According to an example, a front surface of the operation box 80 is a setting panel 84 having a touch panel used by an operator in controlling the FFU 25. The setting panel 84 may also be used by an operator, for example, to issue a command to fill the housing 10 with $N_2$ gas for substrate transport or to replace the $N_2$ gas in the housing 10 with the CDA.

Figure 4:
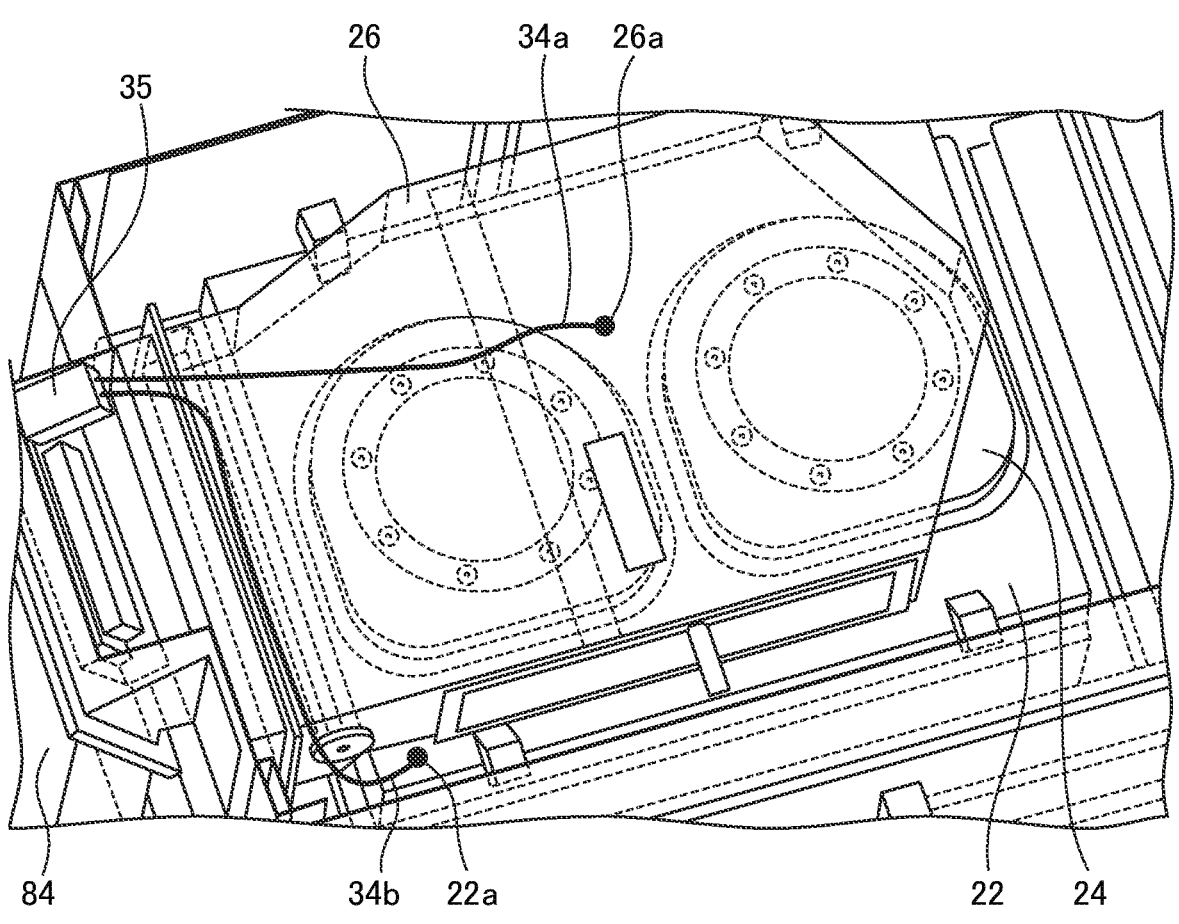
FIG. 4 shows another example of the first port and the second port.

FIG. 4 is a diagram illustrating a configuration example of the FFU 25 and the like. According to one example, the upper housing 26 covers only a portion of a top surface of the FFU housing 22 so that a portion of the top surface of the FFU housing 22 is exposed to the outside. By providing the second port 22a in the top surface of the FFU housing 22, the second port 22a is provided without increasing footprint of the interface module.

Figure 5:
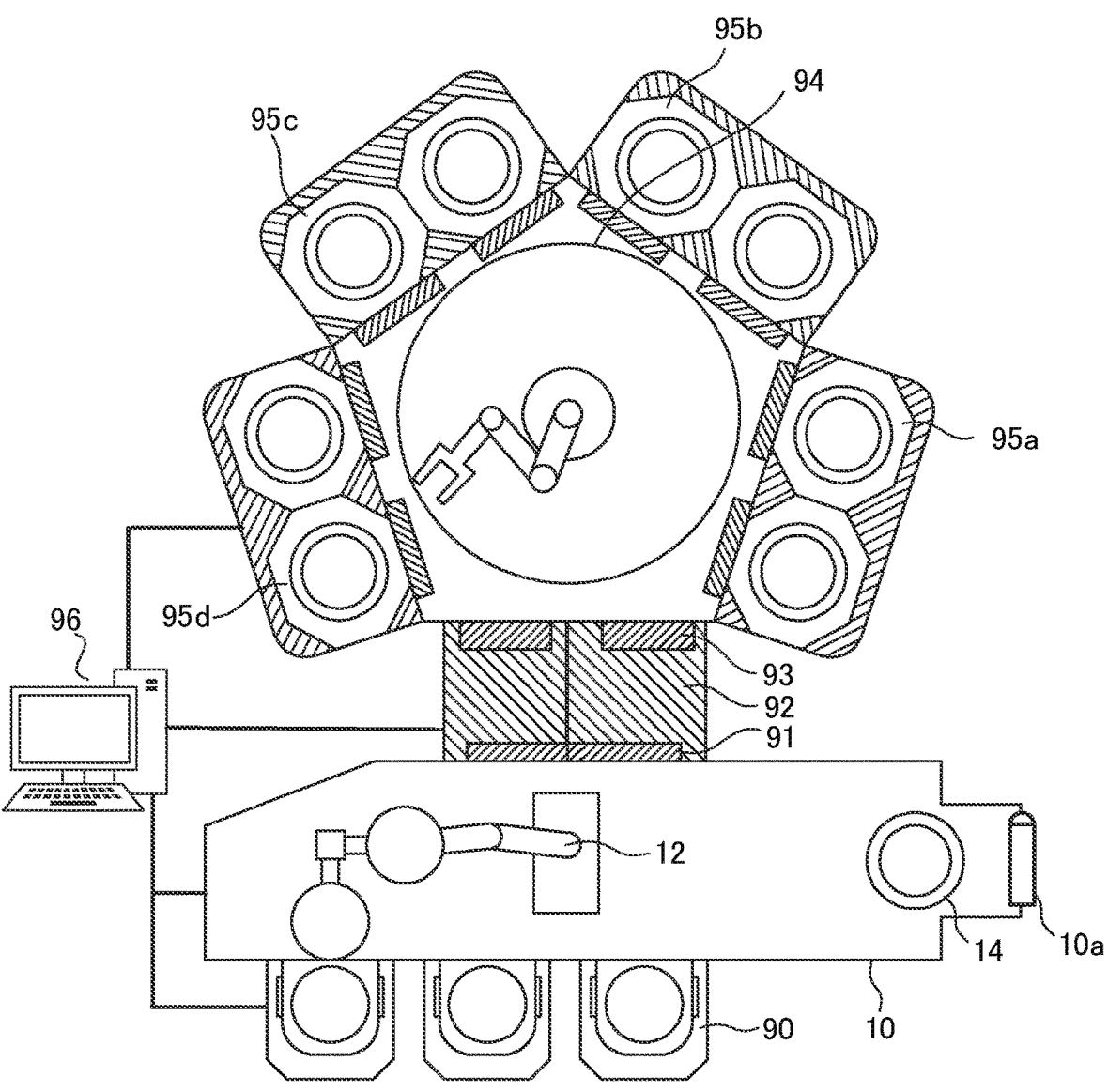
FIG. 5 shows a semiconductor manufacturing apparatus according to one example.

FIG. 5 is a diagram showing a configuration example of a semiconductor manufacturing apparatus including the interface module. A door 10a for a person to enter and exit is attached to the housing 10. The door 10a is referred to as a EFEM door. According to one example, the door 10a is opened and closed by an Electromagnetic Lock Switch. According to one example, opening and closing of the door 10a is controlled by the safety PLC 83. At least one load port 90 is provided next to the housing 10. Further, a Load Lock Module (LLM) 92 is adjacent to the housing 10 via a gate valve 91. A Wafer Handling Chamber (WHC) 94 is adjoined to the LLM 92 via gate valves 93. The WHC 94 is connected to four chamber modules 95a, 95b, 95c, 95d that are used to process substrates. In this example, the interface module serves as an interface for transporting the substrate from one of the LLM 92 and the load port 90 to the other. According to one example, the semiconductor manufacturing apparatus including the interface module is controlled by a controller 96.

Figure 6:
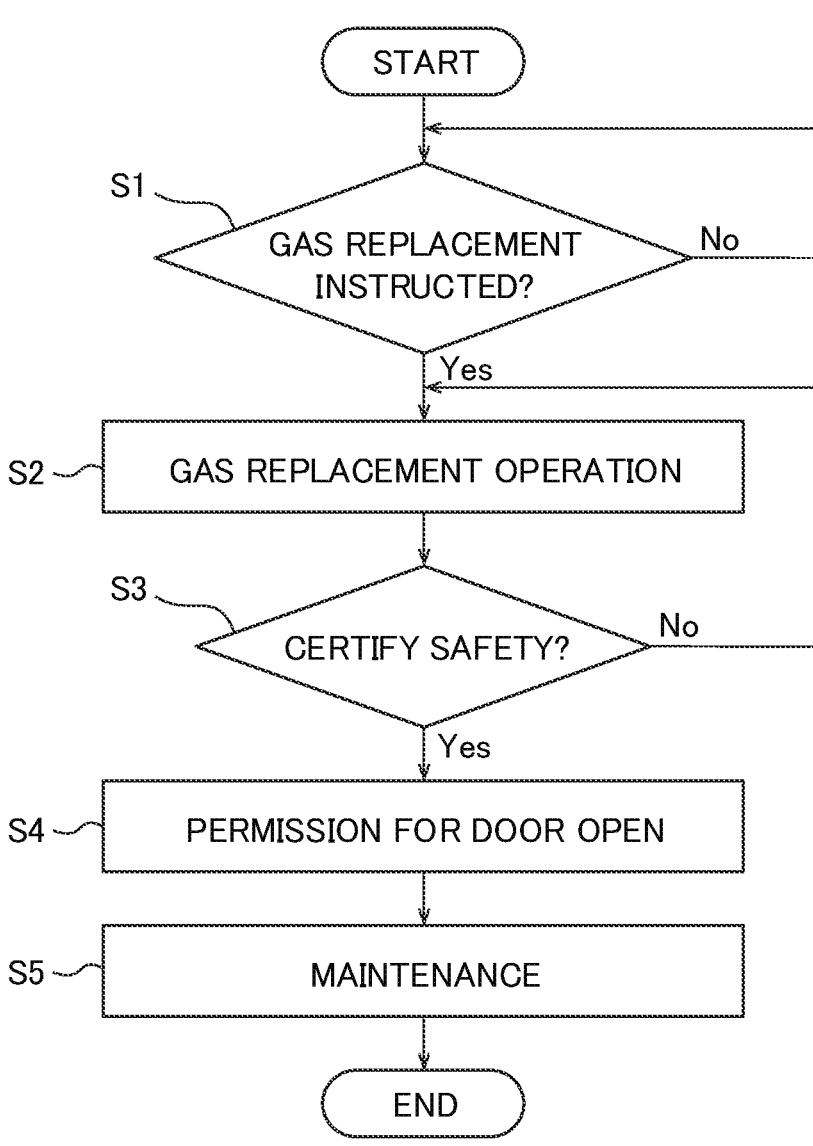
FIG. 6 is a flowchart of a safety verification method.

FIG. 6 is a flowchart of a safety verification method using the interface module. During normal operation of transporting substrates through the housing 10, a nitrogen gas is provided into the housing 10 from the nitrogen gas source 40 via the nitrogen gas supply pipe 48, the upper housing 26, and FFU 25. That is, the interior of the housing 10 is a nitrogen gas atmosphere. According to one example, in order to suppress oxidation of the substrate, $O_2/H_2O$ concentration in the housing 10 is set to 100 ppm or less.

On the other hand, before periodic or abrupt maintenance of the interface module, the $N_2$ gas in the housing 10 is replaced with the CDA to allow a person to enter the housing 10. Referring to FIG. 6, preparation for maintenance will be described. First, the controller 96 of the interface module is commanded to replace the $N_2$ gas in the housing 10 with the CDA for maintenance. According to one example, this command is issued by an operator through the touch panel. According to another example, this command is automatically issued by a process control module (PCM), e.g., included in the controller 96. When the controller 96 receives this command in step S1, the process proceeds to step S2.

In step S2, the controller 96 which has received the command starts a gas replacement operation. The gas replacement operation is an operation for replacing the $N_2$ gas in the housing 10 with the CDA. According to one example, the gas replacement operation includes disabling $N_2$ gas supply to the housing 10, providing the CDA to the housing 10, exhausting the gas in the housing 10, and rotating the fan 24. In the configuration example of FIG. 1, the gas replacement operation includes the following operations:

close the SV 42 to stop the provision of the $N_2$ gas to the housing 10,
   open the valve 54 to provide the CDA to the housing 10,
   driving the pump connected to the exhaust pipe 60 to exhaust the gas in the housing 10, and
   rotate the fan 24 to supply the CDA to the housing 10.

With the gas replacement operation, the $N_2$ gas in the housing 10 is gradually replaced with the CDA. It takes a certain amount of time for the $N_2$ gas to be sufficiently replaced by the CDA and the oxygen concentration in the housing 10 to reach a level safe for the person.

According to one example, the gas replacement operation is maintained for about 30 minutes, so that the oxygen concentration at each place in the housing 10 can be sufficiently increased. In this example, the gas replacement operation may be continued for about one hour with the safety factor of 2.

Then, in step S3, the safety PLC 83 verifies that the gas replacement operation has continued for a predetermined duration. In other words, the safety PLC 83 proves that the devices have been in operation for a predetermined period of time. According to one example, the safety PLC 83 verifies that the following four conditions have persisted for predetermined period.

A first condition: the SV 42 is closed (no $N_2$ gases are provided in the housing 10).

A second condition: the CDA is provided to the housing 10 at a predetermined flow rate.

A third condition: a predetermined exhaust is performed from the housing 10.

A fourth condition: The fan 24 is rotating normally.

According to one example, a mutual monitoring is executed for each of these four conditions. An example of the mutual monitoring is as follows.

By mutually monitoring the open/close of the SV 42 and output of the limit switch 44, a fact that the first condition is satisfied is detected. That is, even if the SV 42 fails, it is possible to detect the failure by the limit switch 44.

By mutually monitoring a value of the flow meter 52 and a value of the housing pressure sensor 13, a fact that the second condition is satisfied is detected. That is, even if the flow meter 52 fails, the failure can be detected by an abnormality in the value of the housing pressure sensor 13.

By mutually monitoring a value of the exhaust pressure sensor 64 and a value of the housing pressure sensor 13, a fact that the third condition is satisfied is detected. That is, even if the exhaust pressure sensor 64 fails, the failure can be detected by an abnormality in the value of the housing pressure sensor 13.

By mutually monitoring an output of the alarm device 82 and values of the differential pressure gauges 35, 37, a fact that the fourth condition is satisfied is detected. That is, if the alarm device 82 fails, the failure of the fan 24 cannot be detected by the alarm device 82. However, if the fan 24 is not rotating, at least one of the values of the differential pressure gauge 35, 37 becomes substantially 0. Therefore, it is possible to detect a failure of the fan 24 from the differential pressure gauges 35, 37. The failure of the alarm device 82 can also be detected because the alarm device 82 does not operate even though the fan 24 has failed. Thus, multiplexing the detection of each condition improves safety. According to another example, another multiplexing method can be employed. That is, by detecting that one condition is satisfied by two different methods, even if an abnormality occurs in one method, the abnormality can be detected by the other method.

By employing mutual monitoring, it is possible to reliably detect that each condition is satisfied. In step S3, if it is confirmed that the first to fourth conditions have continued for a predetermined period of time, the process proceeds to step S4. In step S4, the safety PLC 83 permits opening of the door 10a of the housing 10. According to one example, a permission to open the door 10a is notified to an operator by, for example, lighting of an LED lamp, display on the screen, or voice. According to one example, when permitting opening of the door 10a of the housing 10, the oxygen concentration in the housing 10 is 19.5% or more. Then, in step S5, the operator opens the door 10a of the housing 10 and enters the housing 10 to perform the necessary maintenance.

On the other hand, if it is determined in step S3 that at least one of the first to fourth conditions is not satisfied before the predetermined period of time has elapsed, the safety PLC 83 does not allow the door 10a to be opened. In this case, a cause of the failure of any of the first to fourth conditions is identified and the cause is eliminated. For example, the faulty SV 42 may be repaired, the faulty valve 54 may be repaired, various pressure sensors may be repaired, and the fan 24 may be repaired. Then, the duration of the gas replacement operation is reset, and the gas replacement operation is performed again. For example, when the fan 24 is temporarily stopped, the operation of the fan 24 is restarted, and the elapsed time from that time is counted.

In this example, a continued operation of the fan 24 is proven by mutually monitoring that a failure of the fan 24 is not detected and a differential pressure between an intake side and an exhaust side of the fan 24 is detected. The above-described safety verification method does not require a plurality of oxygen concentration meters and can be realized by a simple configuration. Therefore, it is possible to provide an interface module suitable for cost reduction.

Here, a required performance level PLr of a interlock required for the interface module on which a person is supposed to enter is c (S2, F1, P1). S2 is a level at which severity of a disorder is defined as severe (non-recoverable/death). F1 is defined as a frequency/time of exposure to a hazard "rare to low frequency/short time exposure". P1 means that the possibility of hazard avoidance or hazard limitation is "avoidable under certain conditions". According to ISO13849-1, PLr for (S2, F1, P1) is "c". The interlock category (Cat.) required to achieve PLr=c is 1 to 3, but the safety category must be designed as follows because equipment used in the interlock does not meet (cannot meet) the required specifications.

Cat.=3 (i.e., PL=3)

DC Average=Middle

MTTFd=Low

Figure 7:
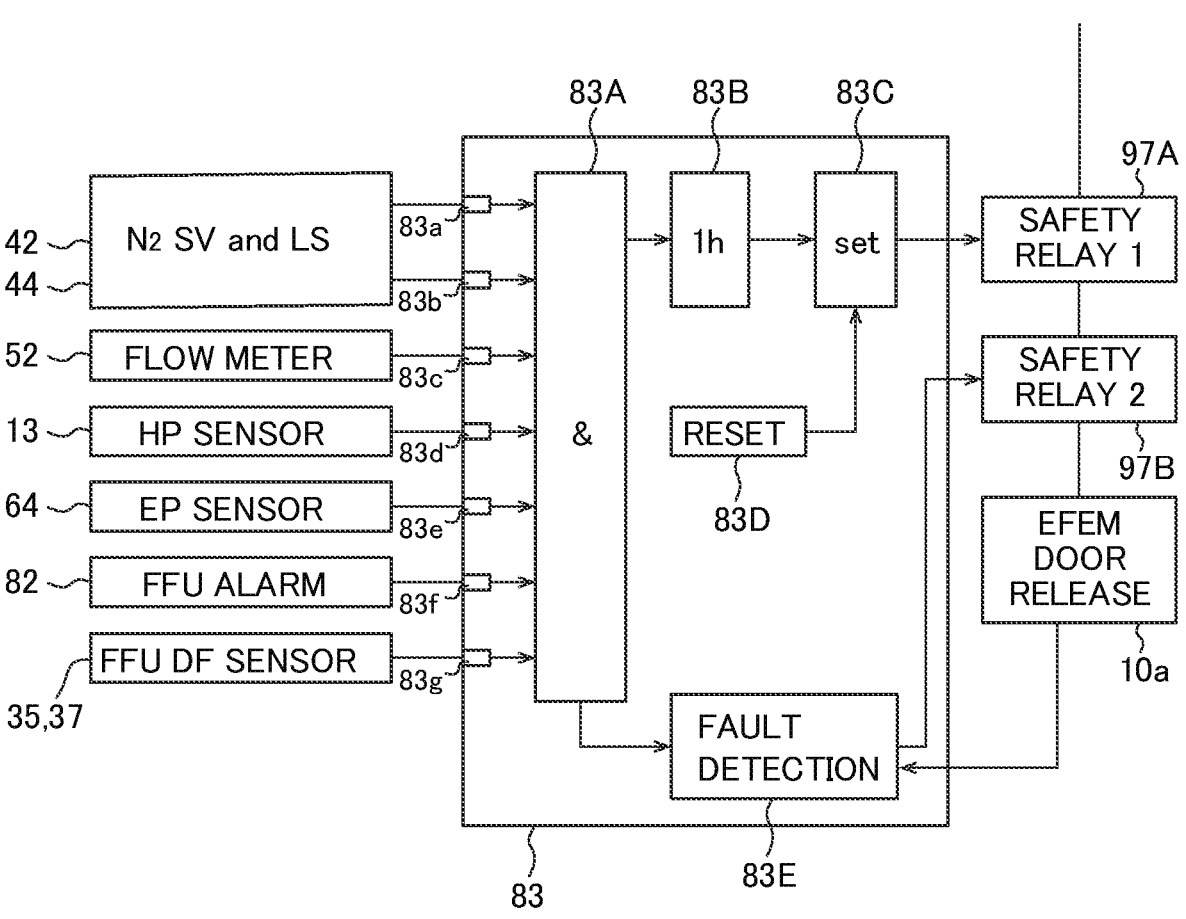
FIG. 7 shows an exemplary functional block diagram of a safety PLC.

In an interlock circuit of the safety category 3, mutual monitoring is required to prove that each condition is satisfied. In addition, it is required that a safety function is not impaired by a single fault. Further, it is required that a single fault is detected, etc. These requirements are described in ISO13849-2. Also shown in ISO13849-1 is a block-diagram of a category 3 circuit. In one example, the safety PLC 83 and the controller 96 may be constructed to satisfy these requirements, FIG. 7 shows an exemplary functional block diagram of the safety PLC 83. The safety PLC 83 operates based on received data for the safety check described above. According to one example, the safety PLC 83 has the following terminals:

a SV terminal 83a to which an electrical status of the SV 42 is inputted, a LS terminal 83b connected to the limit switch 44, a FM terminal 83c connected to the flow meter 52, a HP terminal 83d connected to the housing pressure sensor 13, an EP terminal 83e connected to the exhaust pressure sensor 64, an AL terminal 83f connected to the alarm device 82, and a DP terminal 83g connected to the differential pressure gauges 35, 37.

A mutual monitoring unit 83A is configured to determine that all of the above-mentioned first to fourth conditions are satisfied on the basis of the information obtained through the respective terminals. In one example, the mutual monitoring unit 83A confirms that the SV 42 is closed, the limit switch 44 is not detecting a discrepancy between the input signal to the SV 42 and the actual position of the valve of the SV 42, the flow meter 52 shows a predetermined amount of CDA flow, the housing pressure sensor 13 shows a predetermined pressure, the exhaust pressure sensor 64 shows a predetermined pressure, the alarm device does not issue an alarm, and the differential pressure gauges 35, 37 show a predetermined value. If all of these are confirmed, the mutual monitoring unit 83A notify a time managing unit 83B of the confirmation. The time managing unit 83B receives a signal from the mutual monitoring unit 83A and counts the time in which the first to fourth conditions are satisfied. When the integrated time exceeds, for example, 1 hour, the time managing unit 83B issues a permission signal to open the door 10a of the housing 10 to a setting unit 83C. The setting unit 83C which has received the permission signal changes a connection state of a first relay 97A to allow energizing the Electromagnetic Lock Switch of the door 10a.

According to one example, the safety PLC 83 includes a fault detector 83E. The fault detector 83E is configured to change a connection state of a second relay 97B to allow or prohibit an energization of the Electromagnetic Lock Switch of the door 10a. For example, when some abnormality is detected in the mutual monitoring unit 83A, or when some abnormality occurs in the door 10a, the fault detector 83 E changes or maintains a state of the second relay 97B to prohibit the electromagnetic lock switch of the door 10a from being energized. Examples of anomalies detected by the fault detector 83E are that information cannot be obtained from the terminals or that the information is invalid.

Thus, when a cumulative time for which the first to fourth conditions are satisfied reaches the predetermined time, the safety PLC 83 releases the interlock for opening the doors, i.e., the first relay 97A and the second relay 97B. That is, required conditions (PLr=c, PL=3) can be achieved when replacing the gas in the housing 10 from the $N_2$ gas to the CDA without depending on the O2 sensor.

Figure 8A:
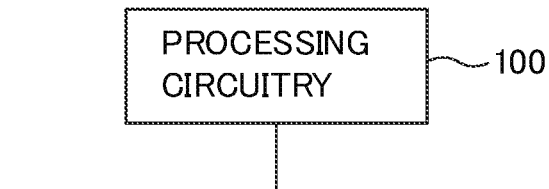
FIG. 8A shows a dedicated hardware.
Figure 8B:
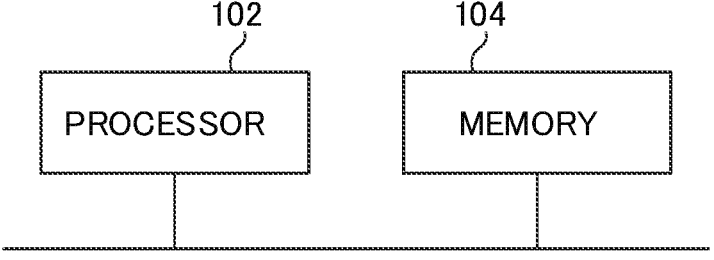
FIG. 8B shows a CPU and a memory.

FIGS. 8A and 8B are diagrams showing configuration examples of the safety PLC 83. The safety PLC 83 has a processing circuit 100. Each of the above-described functions, which is performed in the safety PLC 83, is realized by the processing circuit 100. That is, the process circuit 100 proves that the gas replacement operation has continued for a predetermined amount of time and releases the interlock of EFEM door. The processing circuit 100 may be provided as dedicated hardware (dedicated circuit) or may be a CPU (a central processing unit, a processing device, an arithmetic device, a microprocessor, a microcomputer, a processor, or a DSP) which executes a program stored in a memory. If the processing circuit 100 is dedicated hardware, the processing circuit may be, for example, a single circuit, a composite circuit, a programmed processor, a parallel programmed processor, an ASIC, an FPGA, or combinations thereof.

FIG. 8B shows a configuration example of the safety PLC 83 in the case where the processing circuit is a CPU. In this case, each of the functions of the safety PLC 83 is realized by software or a combination of software and firmware. The software or the firmware is described as a program, and is stored in a memory 104. A processor 102 reads out and executes the program stored in the memory 104, and thereby realizes each of the functions. In other words, the safety PLC 83 includes the memory 104 that stores the program which results in executing each of the above-described steps, when the program is executed by the processing circuit. It can also be said that these programs cause the computer to execute procedures and methods of verifying that the gas replacement operation has continued for a predetermined period of time.

According to one example, a program stored on a computer readable storage medium causes a computer to perform the following:

prove that the $N_2$ gas is not provided to the housing 10 by mutually monitoring the open/close of the SV 42 and output of the limit switch 44, prove that the CDA is provided to the housing 10 by mutually monitoring a value of the flow meter 52 and a value of the housing pressure sensor 13, prove that a gas in the housing is exhausted by mutually monitoring a value of the exhaust pressure sensor 64 and a value of the housing pressure sensor 13, prove that the fan 24 is rotated by mutually monitoring an output of the alarm device 82 and values of the differential pressure gauges 35, 37, and release the interlock of the door 10a of the housing 10 when the first to fourth conditions has been satisfied for a predetermined duration.

According to one example, the release of the interlock is executed by issuing a command to the Electromagnetic Lock Switch of the door 10a. Here, the memory corresponds to, for example, a nonvolatile or volatile semiconductor memory such as a RAM, a ROM, a flash memory, an EPROM and an EEPROM; a magnetic disk; a flexible disk; an optical disk; a compact disk; a mini disk; or a DVD. As a matter of course, it is also acceptable to realize a part of each of the above functions by hardware, and realize a part of the functions by software or firmware. In one example, the controller 96 also includes the processing circuit which is explained with reference to FIGS. 8A, 8B.

The foregoing description is not to be taken in a limiting sense but is by way of example only. Therefore, various modifications are assumed.

The invention claimed is:

1. An interface module comprising:

a fan filter unit (FFU) having a fan, a filter, and an FFU internal space between the fan and the filter;

a housing surrounding a space adjacent to the filter, the housing includes a door;

an upper housing surrounding a space adjacent to the fan;

a first port provided in the upper housing;

a second port communicating to the FFU internal space;

a differential pressure gauge connected to the first port and the second port to detect a differential pressure between an interior of the upper housing and the FFU internal space;

a nitrogen gas source;

a nitrogen gas supply pipe connecting the nitrogen gas source to the upper housing;

a solenoid valve attached to the nitrogen gas supply pipe;

a limit switch installed on the solenoid valve;

a clean dry air source;

a clean dry air supply pipe connecting the clean dry air source to the upper housing, a valve attached to the clean dry air supply pipe; and a flow meter installed on the clean dry air supply pipe.

2. The interface module according to claim 1, wherein the fan filter unit includes an alarm device for detecting a failure of the fan.

3. The interface module according to claim 1, comprising:

a housing pressure sensor configured to measure a pressure in the housing;

an exhaust pipe attached to the housing; and an exhaust pressure sensor configured to measure a pressure in the exhaust pipe.

4. The interface module according to claim 2, comprising a safety PLC including a processor and a memory configured to cause the processor to execute a program stored in the memory, or including a dedicated circuitry, to certify that the fan is rotating by mutual monitoring of an output of the alarm device and a pressure detected by the differential pressure gauge.

5. The interface module according to claim 1, comprising a safety PLC including a processor and a memory configured to cause the processor to execute a program stored in the memory, or including a dedicated circuitry, to release an interlock for opening the door when a predetermined gas replacement operation has continued for a predetermined duration.

6. The interface module according to claim 3, wherein the fan filter unit includes an alarm device for detecting a failure of the fan, and the interface module further comprises a safety PLC having:

a processor and a memory configured to cause the processor to execute a program stored in the memory, or a dedicated circuitry;

a SV terminal connected to the solenoid valve;

a LS terminal connected to the limit switch;

a FM terminal connected to the flow meter;

a HP terminal connected to the housing pressure sensor;

a EP terminal connected to the exhaust pressure sensor;

an AL terminal connected to the alarm device; and a DP terminal connected to the differential pressure gauge.

7. The interface module according to claim 4, comprising an operation box having a setting panel, wherein the safety PLC and the differential pressure gauge are accommodated in the operation box.

8. The interface module according to claim 1, comprising:

a load port adjacent to the housing;

a load lock module adjacent to the housing via a gate valve; and a robotic arm in the housing.

9. A safety verification method comprising:

receiving a command to replace a $N_2$ gas in a housing with clean dry air (CDA);

conducting a gas replacement operation, the gas replacement operation includes disabling $N_2$ gas supply to the housing, providing the CDA to the housing, exhausting a gas in the housing, and rotating a fan for supplying the CDA to the housing;

proving that the gas replacement operation has continued for a predetermined period of time; and permitting opening of a door of the housing after the proving, wherein an absence of the $N_2$ gas supply is verified by mutually monitoring a solenoid valve for regulating the $N_2$ gas supply and an output of a limit switch installed to the solenoid valve.

10. The safety verification method according to claim 9, wherein the rotating of the fan is verified by mutually monitoring a failure of the fan and a differential pressure between an inlet and an outlet of the fan.

11. The safety verification method according to claim 9, wherein the CDA supply to the housing is verified by mutually monitoring a flow meter provided in a supply path of the CDA and a housing pressure sensor.

12. The safety verification method according to claim 9, wherein the exhausting of the gas is verified by mutually monitoring an exhaust pressure sensor and a housing pressure sensor.

13. The safety verification method according to claim 9, wherein when the gas replacement operation has continued for a predetermined period of time, an oxygen concentration in the housing is greater than or equal to 19.5%.

14. The safety verification method according to claim 9, wherein the permitting is notified to an operator by an LED lamp, a display, or voice.

15. The safety verification method according to claim 9, wherein the mutually monitoring of the solenoid valve for regulating the N$_2$ gas supply and the output of the limit switch respectively includes confirming that the solenoid valve is closed and detecting no discrepancy between an input signal of the solenoid valve and an actual position of the solenoid valve.

5

\* \* \* \* \*